US008799728B2

(12) United States Patent
Zhong et al.

(10) Patent No.: US 8,799,728 B2
(45) Date of Patent: *Aug. 5, 2014

(54) ON-DIE LOGIC ANALYZER FOR SEMICONDUCTOR DIE

(71) Applicant: Intel Corporation, Santa Clara, CA (US)

(72) Inventors: Tina C. Zhong, Gilbert, AZ (US); Jason G. Sandri, Gilbert, AZ (US); Kenneth P. Griesser, Gilbert, AZ (US); Lori R. Borger, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/063,549

(22) Filed: Oct. 25, 2013

(65) Prior Publication Data

US 2014/0053026 A1 Feb. 20, 2014

Related U.S. Application Data

(60) Continuation of application No. 13/710,919, filed on Dec. 11, 2012, now Pat. No. 8,589,745, which is a continuation of application No. 13/665,198, filed on Oct. 31, 2012, now Pat. No. 8,543,776, which is a division of application No. 12/541,472, filed on Aug. 14, 2009, now Pat. No. 8,327,198.

(51) Int. Cl.
*G01R 31/28* (2006.01)
*G06F 13/00* (2006.01)
*G01R 31/26* (2014.01)
*G01R 31/3177* (2006.01)
*G01R 31/317* (2006.01)
*G01R 31/3185* (2006.01)
*G01R 31/319* (2006.01)
*G06F 11/25* (2006.01)
*G06F 11/36* (2006.01)
*G06F 11/30* (2006.01)

(52) U.S. Cl.
CPC ...... *G01R 31/3177* (2013.01); *G01R 31/31705* (2013.01); *G01R 31/318511* (2013.01); *G01R 31/318513* (2013.01); *G01R 31/319* (2013.01); *G06F 11/25* (2013.01); *G06F 11/364* (2013.01); *G06F 11/3003* (2013.01); *G06F 11/3089* (2013.01); *G06F 11/3648* (2013.01)
USPC ...... 714/724; 711/153; 711/154; 324/762.03; 324/762.05

(58) Field of Classification Search
CPC .............. G01R 31/3177; G01R 31/31705; G01R 31/318511; G01R 31/318513; G01R 31/319; G06F 11/25; G06F 11/364; G06F 11/3003; G06F 11/3089; G06F 11/3648
USPC .............. 714/724; 711/154, 153; 324/762.03, 324/762.05
See application file for complete search history.

(56) References Cited

U.S. PATENT DOCUMENTS 5,442,639 A 8/1995 Crowder et al.
5,586,279 A 12/1996 Pardo et al.
(Continued)

FOREIGN PATENT DOCUMENTS

WO WO 2009/151738 12/2009

OTHER PUBLICATIONS

U.S. Patent and Trademark Office, Office Action mailed Feb. 1, 2013, with Reply filed Apr. 29, 2013, in U.S. Appl. No. 13/665,198.

(Continued)

*Primary Examiner* — John J Tabone, Jr.
(74) *Attorney, Agent, or Firm* — Trop, Pruner & Hu, P.C.

(57) ABSTRACT

In one embodiment, the present invention includes a semiconductor die such as a system on a chip (SoC) that includes a logic analyzer with a built-in trace buffer to store information communicated between on-die agents at speed and to provide the information to an off-die agent at a slower speed. Other embodiments are described and claimed.

16 Claims, 8 Drawing Sheets

(56) References Cited

U.S. PATENT DOCUMENTS

| | | | |
|---|---|---|---|
| 6,009,488 A | 12/1999 | Kavipurapu | |
| 6,092,127 A | 7/2000 | Tausheck | |
| 6,148,381 A * | 11/2000 | Jotwani | 711/158 |
| 6,237,044 B1 | 5/2001 | Jordan | |
| 6,331,957 B1 * | 12/2001 | Kurts et al. | 365/201 |
| 6,434,681 B1 | 8/2002 | Armangau | |
| 6,636,056 B1 * | 10/2003 | Fleischer | 324/762.02 |
| 6,725,336 B2 * | 4/2004 | Cherabuddi | 711/129 |
| 6,727,722 B2 * | 4/2004 | Whetsel | 324/750.3 |
| 6,775,826 B1 | 8/2004 | Zahavi et al. | |
| 6,813,731 B2 * | 11/2004 | Zahavi et al. | 714/45 |
| 6,834,360 B2 * | 12/2004 | Corti et al. | 714/37 |
| 6,925,544 B2 | 8/2005 | Gresham | |
| 7,047,521 B2 * | 5/2006 | Bunnell | 717/130 |
| 7,080,289 B2 * | 7/2006 | Swaine et al. | 714/45 |
| 7,089,473 B2 * | 8/2006 | Mates | 714/733 |
| 7,143,205 B2 * | 11/2006 | Sakugawa | 710/22 |
| 7,146,543 B2 * | 12/2006 | Higashida et al. | 714/45 |
| 7,213,113 B2 * | 5/2007 | Sahin et al. | 711/162 |
| 7,216,276 B1 * | 5/2007 | Azimi et al. | 714/733 |
| 7,260,692 B1 * | 8/2007 | Zahavi et al. | 711/154 |
| 7,332,929 B1 * | 2/2008 | Normoyle et al. | 326/16 |
| 7,401,199 B2 | 7/2008 | Bhattacharya | |
| 7,454,666 B1 | 11/2008 | Jordan et al. | |
| 7,496,474 B2 * | 2/2009 | Browen et al. | 702/183 |
| 7,562,276 B1 * | 7/2009 | Azimi et al. | 714/733 |
| 7,827,356 B2 | 11/2010 | Venkumahanti et al. | |
| 7,839,162 B2 * | 11/2010 | Hutchings | 326/38 |
| 7,895,430 B2 * | 2/2011 | Luk et al. | 713/2 |
| 7,917,828 B2 * | 3/2011 | Tate et al. | 714/752 |
| 8,067,960 B2 * | 11/2011 | Hutchings et al. | 326/38 |
| 8,074,135 B1 * | 12/2011 | Azimi et al. | 714/742 |
| 8,115,510 B2 * | 2/2012 | Redgrave et al. | 326/38 |
| 8,180,991 B2 | 5/2012 | Ravindranath et al. | |
| 8,225,069 B2 * | 7/2012 | Fang et al. | 711/203 |
| 8,327,198 B2 * | 12/2012 | Zhong et al. | 714/724 |
| 8,543,776 B2 * | 9/2013 | Zhong et al. | 711/153 |
| 8,589,745 B2 * | 11/2013 | Zhong et al. | 714/724 |
| 2005/0041510 A1 | 2/2005 | Khawand et al. | |
| 2006/0117229 A1 * | 6/2006 | Swaine et al. | 714/45 |
| 2006/0251416 A1 * | 11/2006 | Letner et al. | 398/45 |
| 2006/0277441 A1 * | 12/2006 | Edgar et al. | 714/38 |
| 2007/0011492 A1 | 1/2007 | Swaine | |
| 2008/0163034 A1 | 7/2008 | Tate et al. | |
| 2008/0184150 A1 * | 7/2008 | Minato et al. | 715/771 |
| 2008/0244118 A1 | 10/2008 | Accapadi et al. | |
| 2009/0002020 A1 * | 1/2009 | Hutchings et al. | 326/37 |
| 2009/0237110 A1 | 9/2009 | Lunzer et al. | |
| 2009/0307770 A1 * | 12/2009 | Harris et al. | 726/22 |
| 2010/0148808 A1 | 6/2010 | Butler | |
| 2010/0268990 A1 * | 10/2010 | Xu et al. | 714/27 |
| 2011/0153690 A1 | 6/2011 | Allen et al. | |
| 2011/0153691 A1 | 6/2011 | Allen et al. | |
| 2011/0199117 A1 * | 8/2011 | Hutchings et al. | 326/38 |
| 2012/0098567 A1 * | 4/2012 | Hutchings et al. | 326/38 |
| 2012/0117525 A1 * | 5/2012 | Hutchings et al. | 716/103 |

OTHER PUBLICATIONS

U.S. Patent and Trademark Office, Notice of Allowance mailed May 28, 2013 in U.S. Appl. No. 13/665,198.

James L. Peterson, et al., "Operating System Concepts," 1986, 27 pages.

Patent Cooperation Treat, Notification of Transmittal of the International Search Report and the Written Opinion of the International Searching Authority, mailed Feb. 24, 2011 in International application No. PCT/US2010/042608.

State Intellectual Property Office of the People's Republic of China, Office Action mailed Dec. 25, 2012 in Chinese application No. 201010254368.2.

* cited by examiner

ON-DIE LOGIC ANALYZER FOR SEMICONDUCTOR DIE

This application is a continuation of U.S. patent application Ser. No. 13/710,919, filed Dec. 11, 2012, now U.S. Pat. No. 8,589,745, which is a continuation of U.S. patent application Ser. No. 13/665,198 filed Oct. 31, 2012, now U.S. Pat. No. 8,543,776, which is a divisional of U.S. patent application Ser. No. 12/541,472, filed Aug. 14, 2009, now U.S. Pat. No. 8,327,198, the content of which is hereby incorporated by reference.

BACKGROUND

With the complexity of silicon designs growing and the shift to multi-chip integration, challenges in performing post silicon debug increase. For example, system-on-chip (SoC) implementations are becoming more prevalent in many different product lines. As customers expect smaller form factors, the difficulty of debugging such system increases. This is especially so, as interconnects between components on a single silicon die are hidden from capture by an external logic analyzer.

In addition to the rising number of transistors on the silicon, the cost of using external logic analyzers to capture high frequency signals at speed is also growing. Often design teams embed debug hooks in the circuitry. However, due to the sensitive nature of internal nodes and software tools associated with their viewing, these powerful debug features are generally not available to customers. This forces any customer issues to be reproduced in a vendor site lab (versus at the customer site). It can be very difficult to reproduce these issues outside of the customer site.

DETAILED DESCRIPTION

In various embodiments, an on-die-logic-analyzer (ODLA) may be provided as a debug solution for a semiconductor device such as a system-on-chip (SoC). In one embodiment the ODLA may be used to collect data communicated on an interconnect such as a processor-chipset interconnect, for example, a unidirectional front side bus (iFSB). In one implementation, this interconnect may include more than approximately 700 internal signals. These signals cannot be made visible to a conventional logic analyzer located off-chip at a device interface, as the iFSB is buried within the SoC. By providing visibility to the iFSB using an embodiment of the present invention, a debugging engineer is able to obtain precise data flowing in and out of the processor.

Figure 1:
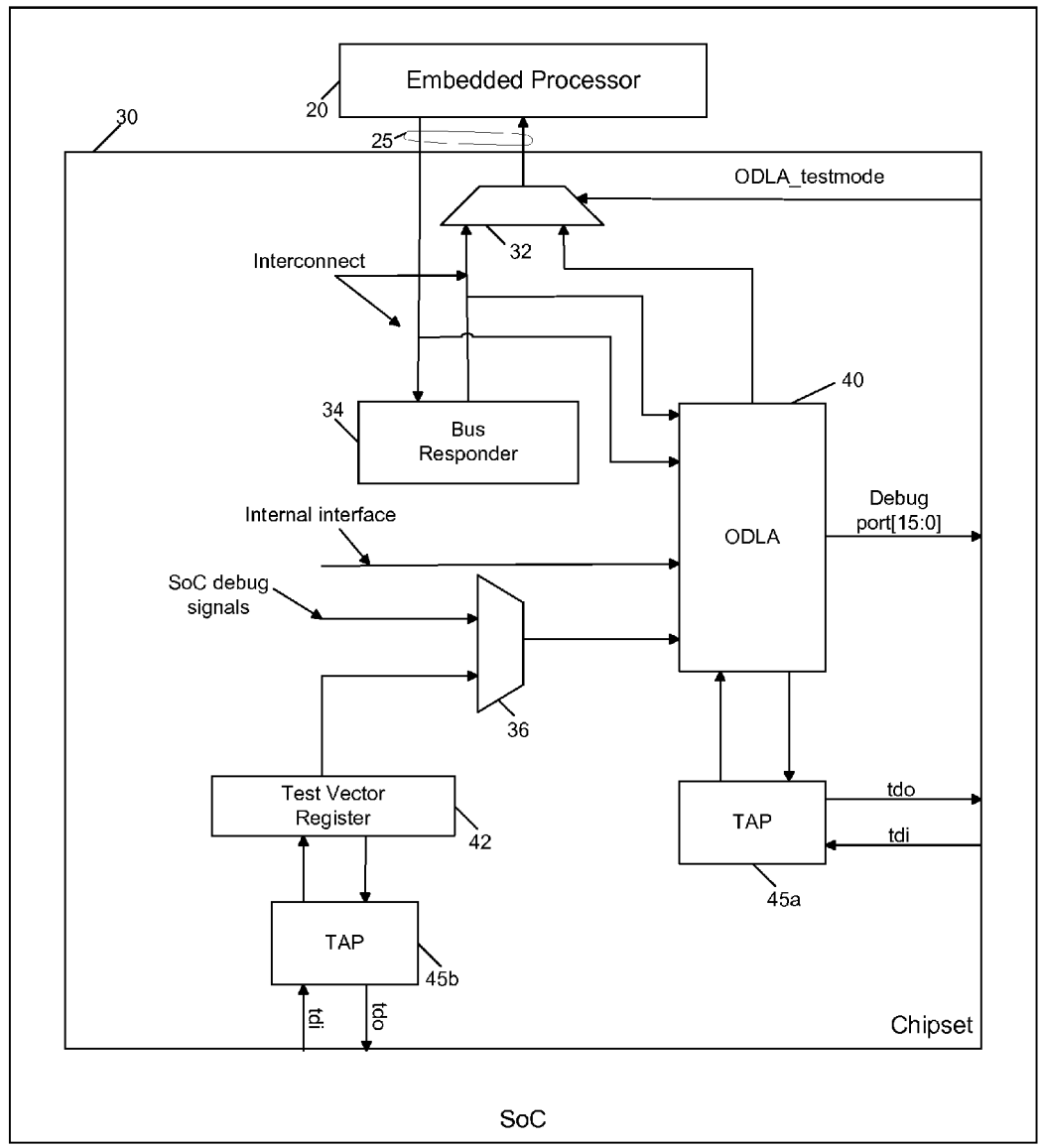
FIG. 1 is a block diagram of an integrated circuit in accordance with one embodiment of the present invention.

Referring now to FIG. 1, shown is a block diagram of an integrated circuit 10 which in some embodiments may be a SoC. As seen, the main components of the SoC include a processor 20 which may be a central processing unit (CPU) such as an embedded Intel Architecture™ processor or another such CPU. In turn, processor 20 may be coupled to a chipset 30 via an interconnect 25, which in one embodiment may be an embedded frontside bus interconnect including a plurality of lanes each traveling in one direction. Thus, unidirectional wires may couple from processor 20 to chipset 30 and vice-versa.

As further seen in FIG. 1 chipset 30 may include various components. For ease of illustration, understand that the primary logic of the chipset, which may be used to enable communication between the processor and various other components of the SoC (such as dedicated logic units, memory controllers, peripheral controllers and so forth) is not shown. Instead, FIG. 1 shows the high level components of chipset 30 involved in performing debug and test operations in accordance with an embodiment of the present invention.

As seen, communications from processor 20 may be provided to a bus responder 34 and further to an ODLA 40. In turn, communications from bus responder 34 to processor 20 may be provided through a multiplexer 32, which further receives an input from ODLA 40. As seen, multiplexer 32 may be controlled by a test mode signal (ODLA_testmode) to select either data of bus responder 34 or ODLA 40 for transmission to processor 20, depending on whether a test mode is activated, in which case the ODLA data is provided.

As further seen, ODLA 40 may receive inputs from an internal interface as well as from a second multiplexer 36, which is coupled to receive debug signals and information via a test vector register 42 and which in turn may be coupled to a test access port (TAP) interface 45b. The TAP interface may be compliant with the Institute of Electrical and Electronics Engineers (IEEE) 1149.1-1990, Joint Test Action Group (JTAG) standards. As seen, interface 45b may communicate serially with an off-chip component via an input serial line (TDI) and an output serial line (TDO). As further seen, a second TAP interface 45a may couple directly to ODLA 40. In turn, ODLA 40 may communicate off-chip using a debug port (not shown in FIG. 1) via a parallel bus, e.g., a 16-bit parallel data bus plus a one bit clock line. While shown with this particular implementation in the embodiment of FIG. 1, the scope of the present invention is not limited in this regard.

As seen, the ODLA is implemented on the silicon as a self-contained unit. In one embodiment, the ODLA is situated in the chipset, although in other embodiments, it may be situated between the processor and the chipset or another on-die location. The ODLA spies on the interface signals and captures traces into an internal buffer (not shown in FIG. 1). At the end of trace capture, a user can unload the buffer content, e.g., through the debug port or the TAP port. The user will typically connect the debug port to an external logic analyzer or an extended debug port. The data pushed through the debug port starts with a header pattern and follows a certain order, e.g., a fixed order so that post-processing software can reconstruct the data. The data collected through both ports also contain timing information. The header pattern, offload order, and timing information are made known to the user so that the information can be easily parsed and reconstructed to show clock-by-clock activity on the iFSB.

The ODLA provides a comprehensive set of triggers which enables the user to create a trigger on a desired event and efficiently utilize the limited on-chip trace buffer. For example, a trigger can either start or stop a trace capture action. In addition, a repeating event can be retriggered. In one embodiment, triggers can be programmed through internal registers of the ODLA. This register block also contains other configuration registers that can be accessible through a primary memory mapped interface (e.g., debug port) or a secondary TAP interface.

In addition to spying on the iFSB, the ODLA allows the SoC to extend the capture capability to other signals for specific custom debug purposes. In various embodiments, such debug signals may come from various locations on the chip. For example, many different logic blocks of the chip may have one or more internal observation nodes associated therewith. The signals from these various observation nodes may then be provided to an internal node observation module, where they are collected. These signals may then be provided to the ODLA (e.g., through multiplexer 36) for further processing, storage, and transmission to an off-chip agent. Similar to the iFSB, the ODLA captures these signals in its buffer and provides observability on a clock-by-clock basis. Thus unit level observation nodes can be routed into the ODLA. Rather than being limited to observing only a small bit width (e.g., 32 bits) at a time and running a test multiple times, embodiments may be used to run a test only once and then obtain all observed signals.

Due to the SoC encapsulated architecture, the ODLA lends itself well to providing responses to the processor for high volume manufacturing (HVM) testing. The ODLA can act as an agent on the iFSB to provide deterministic responses for functional test and debug, which can be useful for functional HVM testing for structural, speed, and power screening by providing a functional built in self-test (BIST) capability. Furthermore when combined with targeted hardware tests, embodiments may facilitate failure analysis and fault isolation for parts failing in the field.

To enable data collection, the ODLA buffer can be set up in such a way that the processor-to-chipset and chipset-to-processor transactions are separated from each other. Hence, a queue of the buffer associated with the chipset-to-processor transactions can be pre-loaded with the test content obtained, e.g., through the TAP port. Then a trigger is set to start a drive-back mode. During the drive-back, test contents are driven to the processor while the buffer captures any transactions from the processor to the chipset. In this special test mode, the ODLA replaces the bus responder for transmission of signals on the internal bus. To do this, it shares the same agent identifier (ID) as the bus responder in normal mode. Hence, no additional logic is required to arbitrate between the two agents. When the test is complete, the trace captured in the buffer is unloaded for comparison and for examining a pass/fail condition during the HVM testing. Embodiments can be extended to enable encapsulation of functional test content for HVM testing, thereby eliminating the need for the chipset (or any other agent on the CPU interface) to implement special hardware to support functional HVM testing for the CPU.

Figure 2:
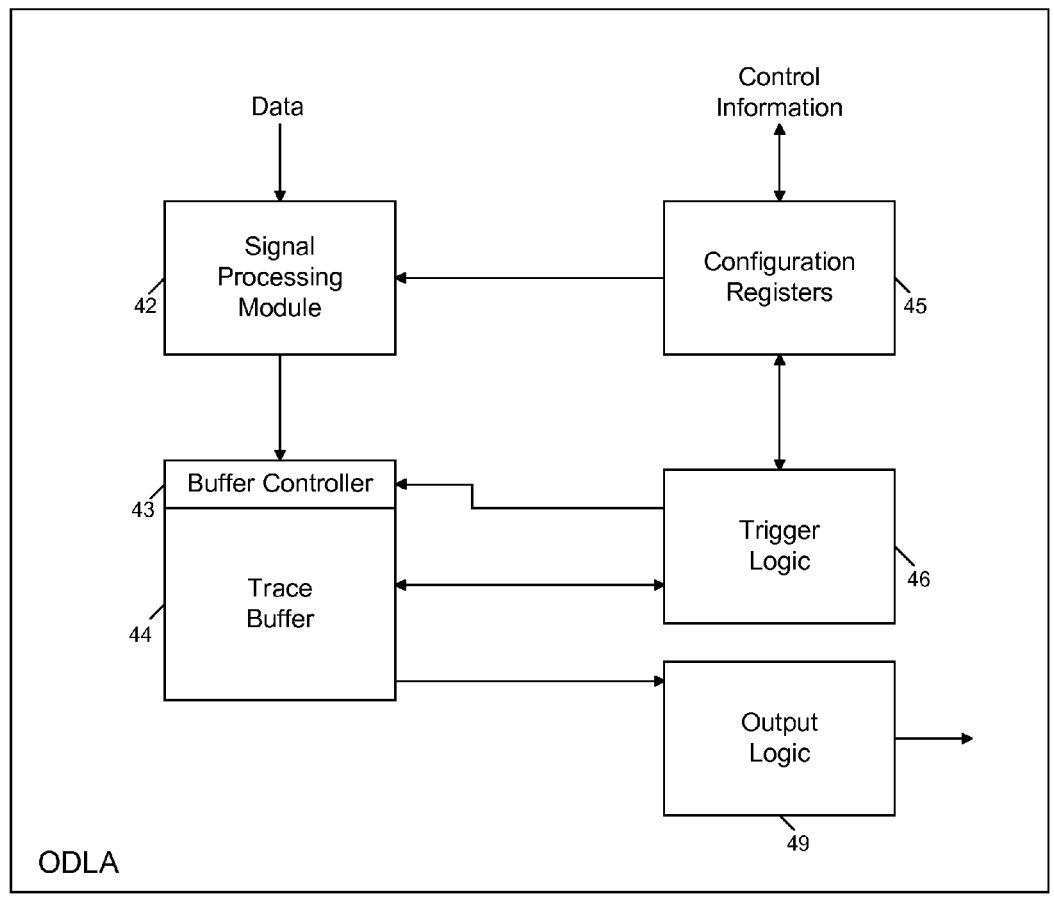
FIG. 2 is a block diagram of an on-die logic analyzer in accordance with an embodiment of the present invention.

As described above, the ODLA may include various components including logic components, control components and storage which may include volatile and non-volatile storage. Referring now to FIG. 2, shown is a block diagram of various components present in an on-die logic analyzer in accordance with an embodiment of the present invention. As shown in FIG. 2, ODLA 40 may include various components to receive and process signals from various portions of a SoC or other semiconductor device. As seen, incoming data to be stored into ODLA 40 may be received by a signal processing module 42. Processing module 42 may perform various processing, e.g., to place the signals in appropriate format for storage in a trace buffer 44. In various embodiments, trace buffer 44 may be any type of volatile or non-volatile memory, such as a random access memory (RAM), flash memory or so forth. As seen, a buffer controller 43 may be coupled to or part of trace buffer 44 and may be used to enable dynamic queue combining, as discussed further below. Still further, buffer controller 43 may perform various matching/filtering operations, as also discussed below, so that only a limited amount of received data need actually be stored into trace buffer 44, thus easing storage requirements and enabling on-die debugging using a smaller-sized buffer, reducing die consumption.

As seen, a trigger logic 46 may be in communication with buffer controller 43 to enable initiation/termination of trace storage. Trigger logic 46 may in turn be controlled based on information present in one or more configuration registers 45, which may be loaded with control information received from the SoC or a user. The registers may also include command and status registers. In one embodiment, memory mapped input/output (IO) transactions can be used to program registers 45. In addition, an output logic 49 may output trace data from trace buffer 44 to an external agent such as an external logic analyzer or other signal processor. While shown with this particular implementation in the embodiment of FIG. 2, the scope of the present invention is not limited in this regard.

In one embodiment, the trace buffer 44 can be divided into multiple sections (or queues). Inputs to each queue may originate from multiple sources. For example, each queue can be configured to receive an input from the internal interconnect and from other debug nodes present on the chip. A multiplexer or other selector can be used to select one of the sources as the input. When all of the sources to a particular queue are turned off by design, the inactive queue can be combined with an active queue to act as an overflow queue. This effectively increases the storage size for one queue and maximizes the utilization of the die area consumed by combining the different queues when possible.

Figure 3:
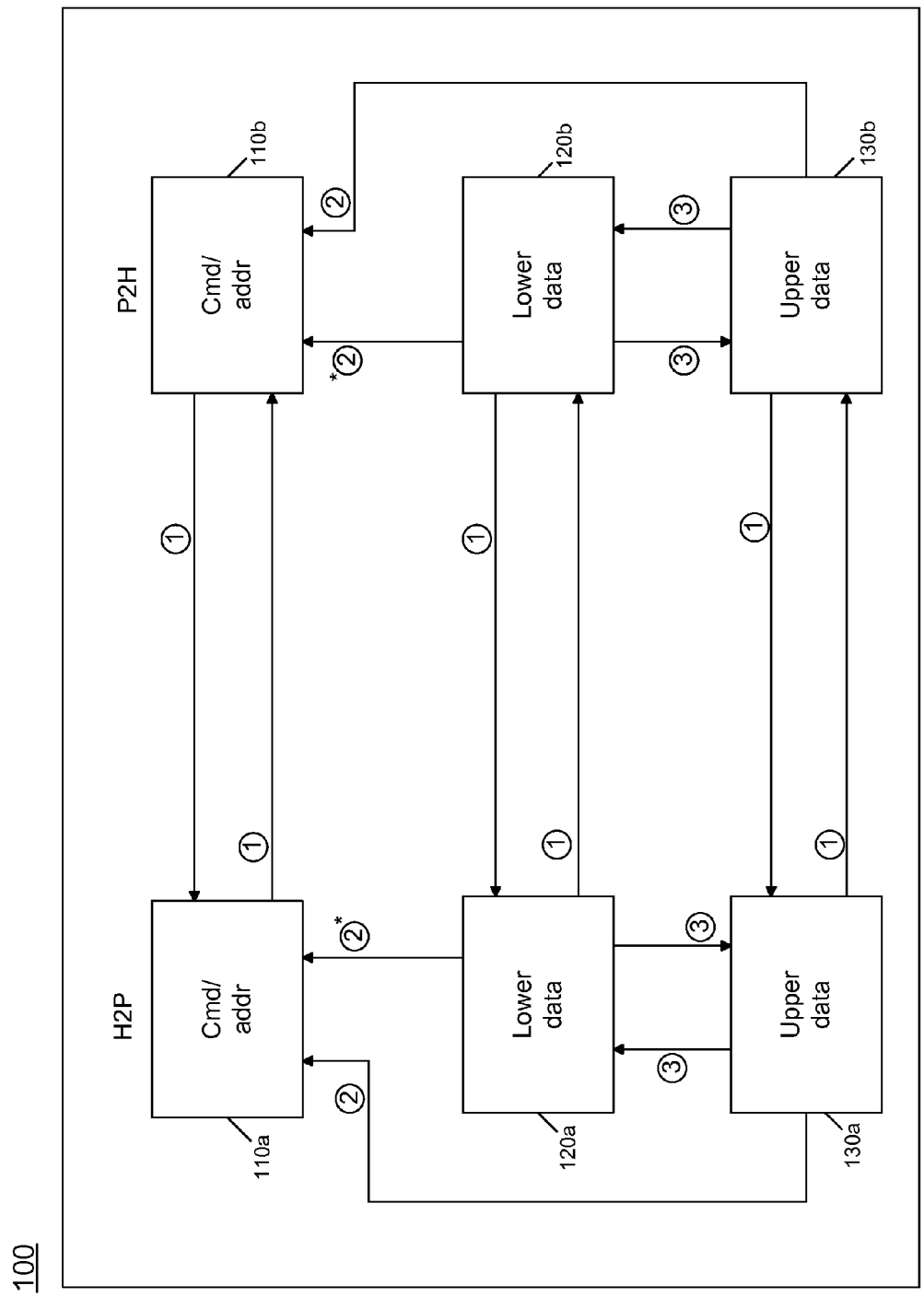
FIG. 3 is a block diagram of a plurality of queues of a trace buffer in accordance with one embodiment of the present invention.

In one embodiment, the queues can be combined based on a logic table. Referring now to FIG. 3, shown is a block diagram of a plurality of queues of a trace buffer in accordance with one embodiment of the present invention. As shown in FIG. 3, buffer 100 includes a plurality of individual queues including command/address (CMD/ADDR) queues 110a and 110b, lower data queues 120a and 120b, and upper data queues 130a and 130b. Each of these queues may be of a given width and size, e.g., 128 bits wide. Thus as seen, command and address information from the bus may be stored in command/address queues 110, while different portions of bus data, e.g., low and high portions, may be stored in lower and upper data queues 120 and 130. In many implementations, much of the debug information desired to be obtained may be associated with the command/address information available on the bus. Accordingly, in such cases, dynamic queue combining can enable unused data queues to act as additional storage for one of the command/address queues 110.

Queue combining between the cores can be realized using control logic and a logic table. Specifically, as seen in FIG. 3, the numbers of the arrowed lines between the queues represent priority in which a queue can be combined. For instance, when the lower data queue (P2H) 120b is inactive, it is first combined with the opposite lower data queue (H2P) 120a. If lower data queue 120a happens to be inactive as well, queue 120b can be combined with cmd/addr queue 110b. If this queue is not active either, queue 120b can be combined with upper data queue 130b. In this arrangement, when both lower and upper data queues 120b and 130b are inactive and intend to be combined with the cmd/addr queue 110b, the lower data queue has the priority, indicated by the asterisk in FIG. 3 to show the priority between the two queues. Although the implementation shown in FIG. 3 combines two queues at a time to simplify, other options are possible. Note that the partitioning of individual queues depends on the information to be captured. For example, if another application may use the dynamic queue combining to information other than address, data, and control. In addition, it is to be understood that the width and size of the queue need not be fixed, but can vary depending on how much room is available on an application.

When an inactive queue is combined with an active queue, the inactive queue becomes the secondary, i.e., overflow, queue. The input to the primary queue becomes the input to the secondary queue. Hence, in an embodiment in which each queue normally has two inputs, a third input source is provided for dynamic queue combining in accordance with one embodiment of the present invention. This third source is only available when the queue is inactive.

Figure 4:
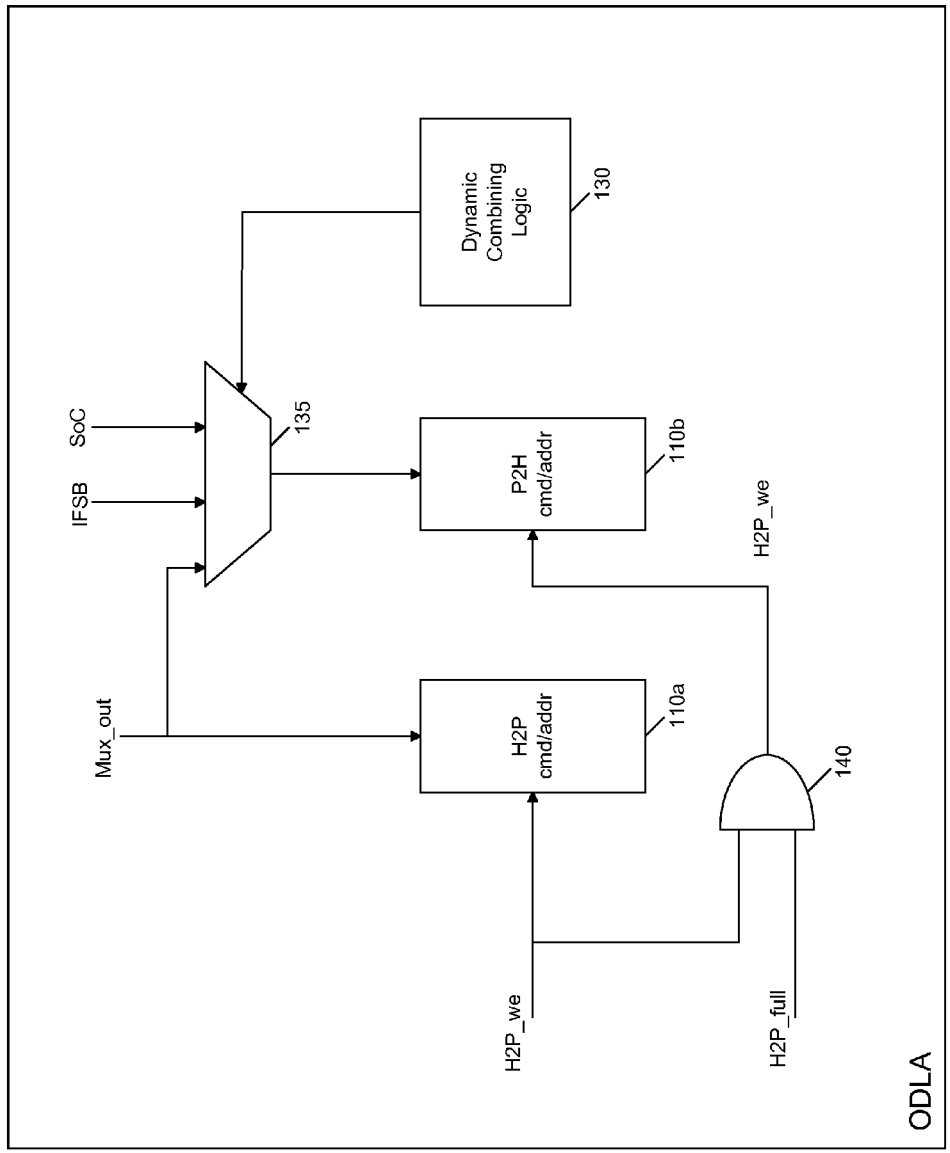
FIG. 4 is a block diagram of the inputs for a queue of a trace buffer in accordance with one embodiment of the present invention.

Referring now to FIG. 4, shown is a block diagram of the inputs for a queue of a trace buffer in accordance with one embodiment of the present invention. Specifically FIG. 4 shows inputs for one queue only. That is, only the inputs for P2H cmd/addr queue 110b are shown. It is to be understood that similar inputs may be provided to H2P queue 110a. Specifically, as seen in FIG. 4, a three source multiplexer 135 is coupled to queue 110b, and is controlled by dynamic combining logic 130. In various embodiments, combining logic 130 may include a logic table in accordance with an embodiment of the present invention to determine based on the state of the various queues and other configuration registers of the ODLA, which input to multiplexer 135 is to be provided to queue 110b. As seen, the three inputs to multiplexer 135 may include signal information from the internal interconnect (iFSB), information from other debug signals present in the device (SoC), and the output of a similar multiplexer that is coupled to command/address queue 110.

When queue 110b is inactive and queue 110a is full, as indicated by the H2P_full signal, a write enable signal can be provided to queue 110b. Specifically, a logic gate 140, e.g., an AND logic gate, may receive the full buffer signal, as well as a write enable signal (H2P_we) for buffer 110a and if both signals are active, a write enable signal is generated for queue 110b. In this way, the multiplexed output (Mux_out) for queue 110a is selected by combining logic 130 as the input to queue 110b. While shown with this particular implementation in the embodiment of FIG. 4, understand the scope of the present invention is not limited in this regard. For example, while the dynamic buffering is described herein for an ODLA type of design, it can be applied to any other design that involves storage elements to provide dynamic size changes for added flexibility, including in a design outside of a debug usage model.

Embodiments may provide efficiency into a design and offer a wide selection to a silicon debug team's usage model. When the silicon debug team zooms in on a particular issue, extensive trace capture may be needed from a group of signals, while other signals are insignificant. Without queue combining, the trace buffer would have a fixed size, and would waste inactive queue space while starving the active queues. Dynamic queue combining in accordance with an embodiment of the present invention can save die area and automatically increase the queue size for unpredictable debug scenarios. The user only needs to determine which inputs are necessary under a particular debug condition. The rest of the action takes place hidden away from the user without additional effort or manual programming on the user's part.

Figure 5:
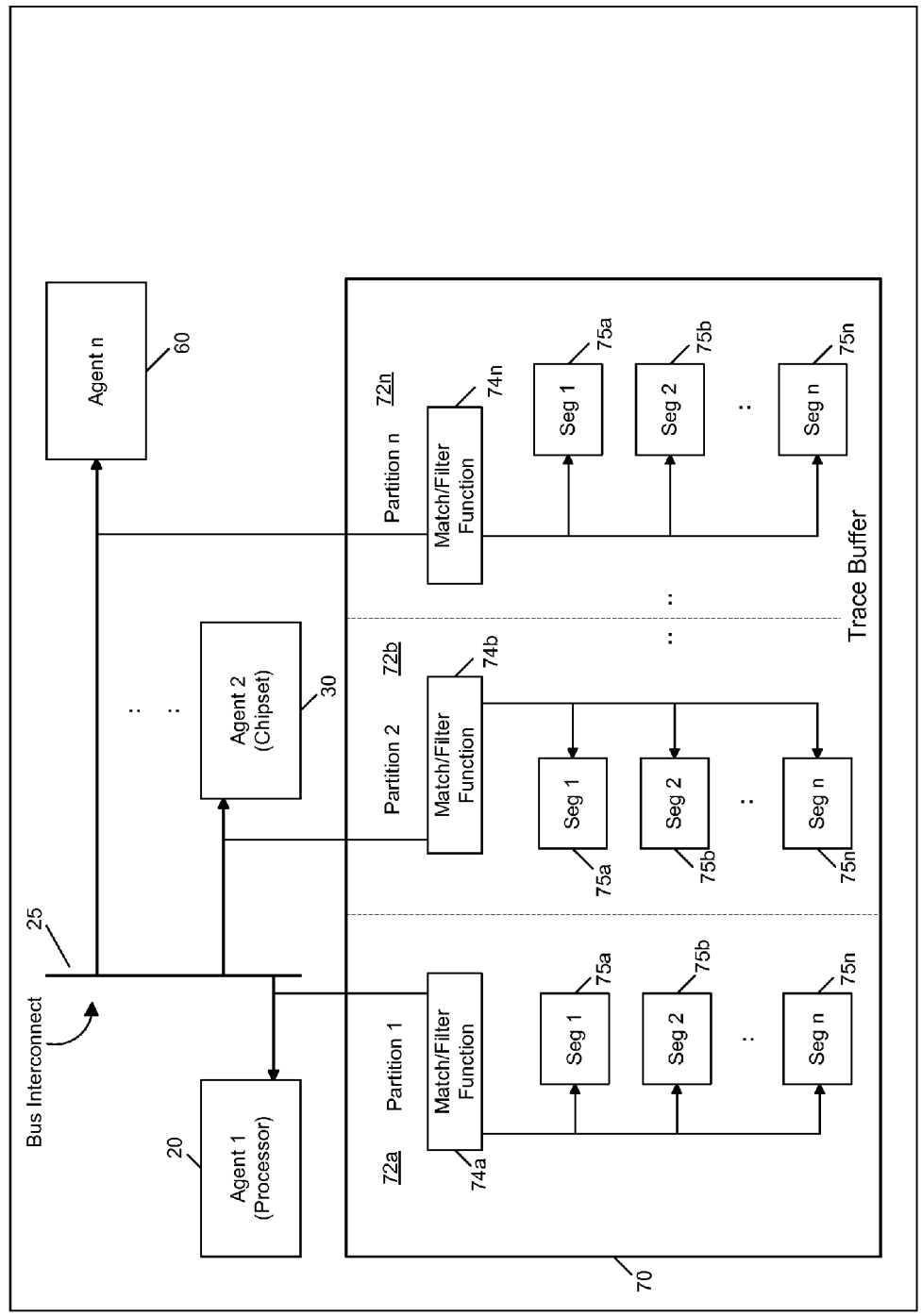
FIG. 5 is an overview of a bus and storage architecture in accordance with one embodiment of the present invention.

As described above, the iFSB interconnect bus may include address, data, and command signals, and can be unidirectional. FIG. 5 shows an overview of the architecture of the bus and its relation to a buffer in accordance with one embodiment of the present invention. As seen in FIG. 5, interconnect 25 may be formed of unidirectional links and may include n sets of similar signals, e.g., command, address and data signals, for each agent. In the embodiment shown in FIG. 5, such agents include processor 20 and chipset 30. However, additional agents such as an agent 60 may be present. As further shown in FIG. 5, a set of storage elements may be associated with the interconnect system. Specifically, storage unit 70 may include a plurality of different storage elements, partitioned into separate partitions $72a$-$72n$, each associated with one of the agents coupled to the bus interconnect. As further shown, each partition 72 may include a match/filter function 74 and a plurality of segments $75_1$-$75_n$. Thus storage of information from the agents on the interconnect may be partitioned into n parts. Each partition 72 is saved independently into a storage element. The storage of each partition can further be divided into smaller segments 75 to accommodate the different functionality of the signals. As one example, like the partitioning shown in FIG. 3, different signal types, e.g., command/address and data (low) and data (high) can be stored in different segments 75. Signals can be captured on every clock edge. A timestamp can also be saved along with each entry in the storage. However, to reduce the amount of storage space needed, a store-on-change feature may be provided in which a particular segment is only saved when one or more signals in that segment toggles. Since each segment is independent of each other, the timestamp provides a way to correlate entries across the segments and to recreate a cycle accurate transaction flow on the interconnect.

In addition, function block 74 can perform different match functions that detect various patterns on each segment or a combination of patterns on multiple segments. The result of the match functions determine if the transaction associated with that pattern should be stored or filtered. That is, non-matching patterns may be filtered (i.e., not stored) to reduce storage requirements. The match function may be configured to allow matching of address, data and control bits, e.g., memory read, memory write or IO transactions. Filtering can be based on a particular address and it may be used to select those addresses to be stored in the queue, or can be used to prevent certain addresses from being stored in the queue. In addition, embodiments may include compression logic as part of the match/filter function. In some embodiments, match function 74 may be used to determine what events to start/stop a trigger. For example, a start trigger will only start capturing content once an event is reached (such as a predetermined counter reaching a certain value or so forth). In contrast, a stop trigger will start capture on reset and will stop whenever a predetermined event happens. Other configurations can use a combination of start and stop triggering. For example, there can be counters for multiple events and which can enable sequential triggering.

Embodiments thus offer cycle accurate capture of an entire bus. This information can be used to solve a bug when there are no apparent leads in a situation. In addition, the configurable option offers debug engineers great flexibility to capture different information under various scenarios. When a bug takes long hours to hit, the filters help to zoom in on something of interest and also save the storage space by saving only the needed information.

Figure 6:
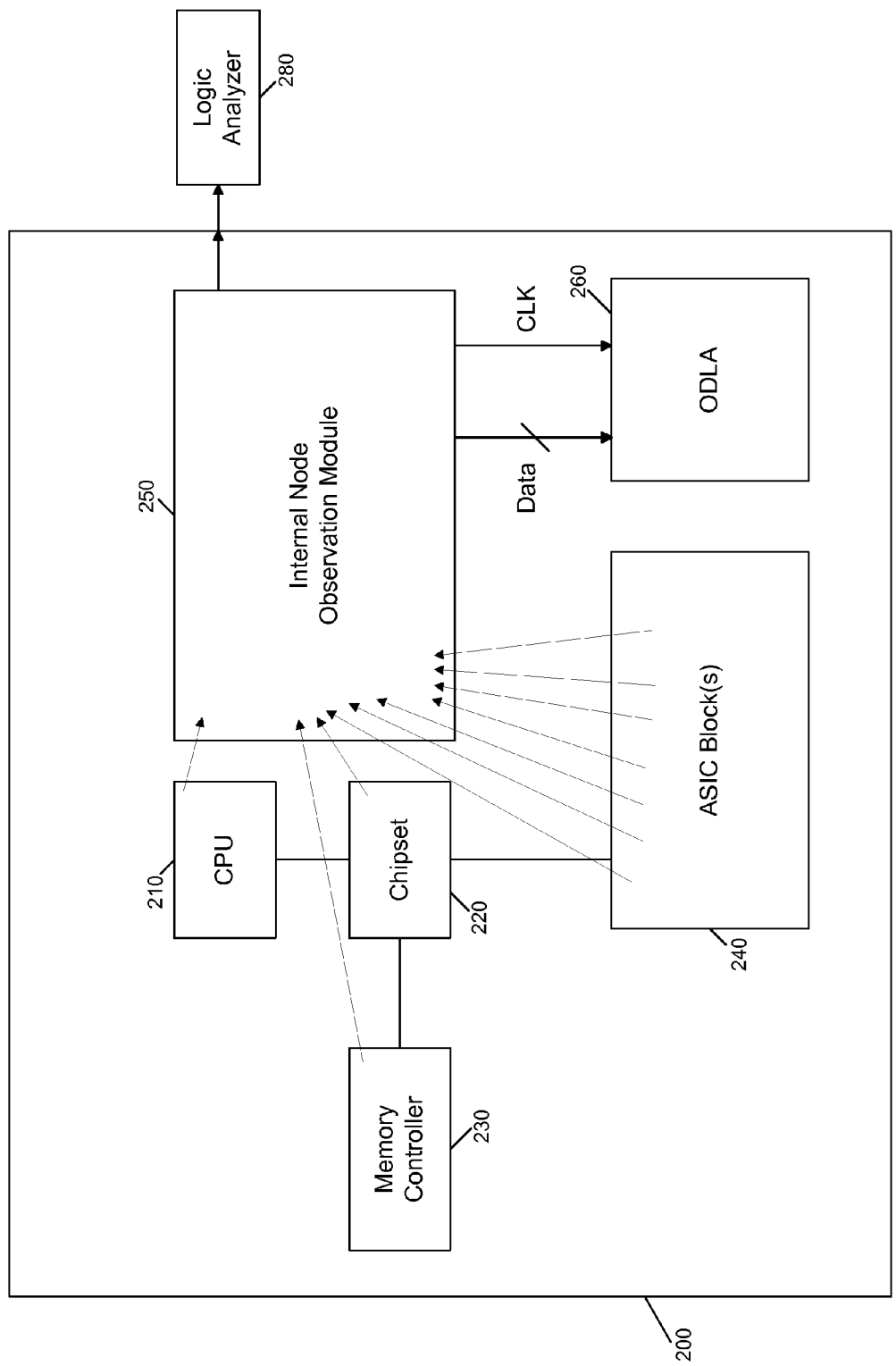
FIG. 6 shows a system level diagram of another embodiment of the present invention.

FIG. 6 shows a system level diagram of another embodiment of the present invention. As seen in FIG. 6, a system 200 may be a SoC or system formed using individual components. In the embodiment shown in FIG. 6, such components may include a CPU 210 coupled via a chipset 220 to a memory controller 230. In addition various application specific integrated circuit (ASIC) blocks 240 may be coupled to CPU 210 via chipset 220. To enable debugging of various internal nodes, an internal node observation module 250 may be provided and which may be in communication with an external logic analyzer 280. However, rather than attempting to recover a large number of signals from the various internal blocks using logic analyzer 280, embodiments may include an ODLA 260, such as described above with regard to FIG. 2. As seen, ODLA 260 may be coupled to receive signal and clock information from internal node observation module 250. In one embodiment, internal node observation module 250 provides the data and at least one clock to ODLA 260 source synchronously.

Figure 7:
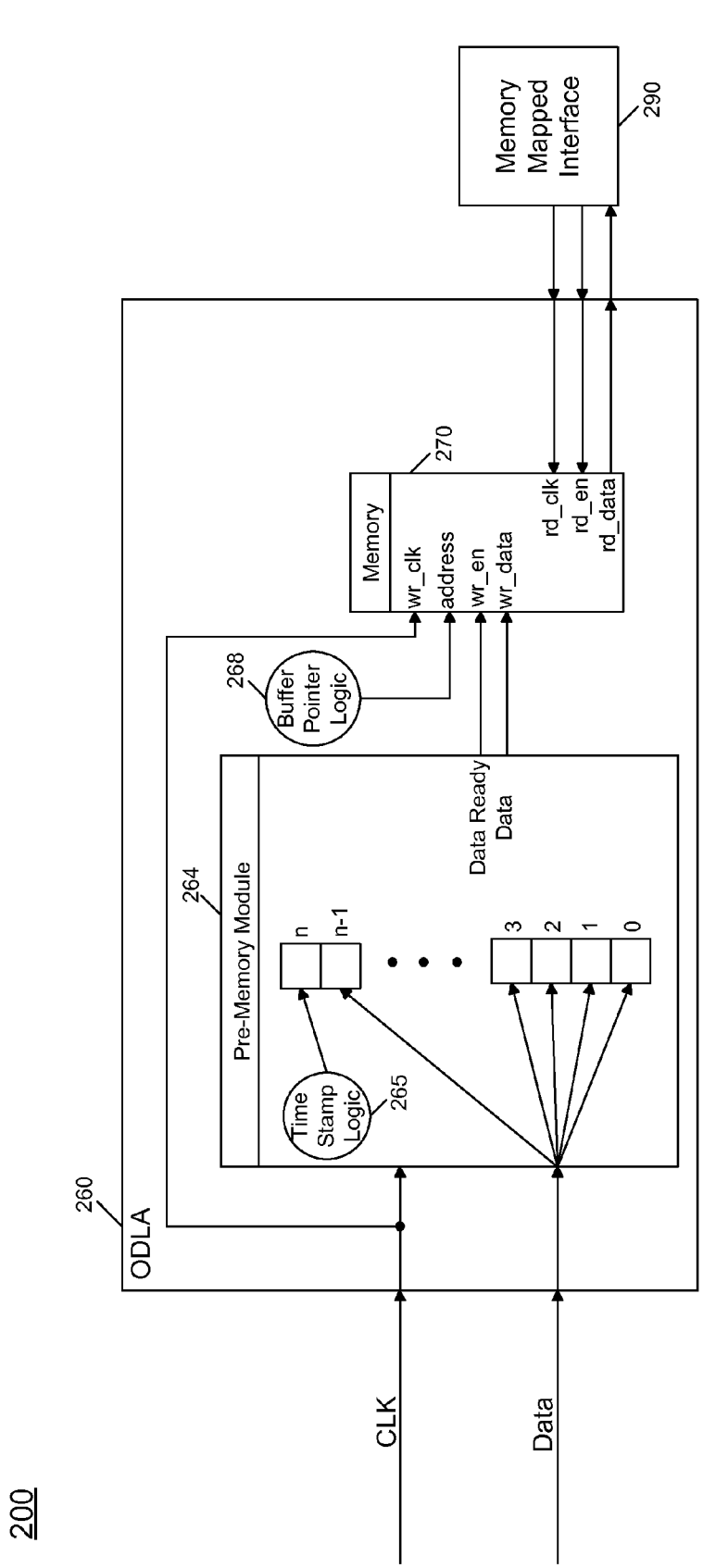
FIG. 7 is a block diagram of a portion of an on-die logic analyzer in accordance with one embodiment of the present invention.

Further details regarding the ODLA are shown with regard to FIG. 7. As seen in FIG. 7, ODLA 260 is coupled to receive data and clock information from internal node observation module 250. In the implementation shown in FIG. 7, a single clock line and 8 data lines may be provided, although the scope of the present invention is not limited in this regard. Both the clock and data may be provided to a pre-memory module 264, which places the data in a form suitable for storage in a corresponding memory, which in one embodiment may be a random access memory (RAM) 270.

Pre-memory module 264 packages internal node observation signals into the correct width of memory 270. The pre-memory data blocks can be filled from 1 to n−1 per memory line. As seen, module 264 includes a time stamp logic 265. During the package data formation, timestamp logic 265 also updates the data block[n] cell with a time stamp. This time stamp may be used to correlate events occurring in the system, e.g., a communication between first and second agents with another event occurring at another agent. Thus this correlation can be used to help debug and reconstruct data after it is off-loaded from memory 270 to an external device. When an entire line of data is full, the packaged data is presented to memory 270 for capture. In various embodiments, memory 270 also provides synchronization between the write and read clock domains. To determine an appropriate location for storage in RAM 270, a buffer pointer logic 268 may be coupled to provide an address to RAM 270. In turn, ODLA 260 may communicate with an external device via a memory mapped interface 290, and which can be coupled to the external device via the debut port. While shown with this particular implementation in the embodiment of FIG. 7, understand the scope of the present invention is not limited in this regard.

During a traditional debug scenario, engineers would typically connect the external logic analyzer 280 to the internal node observation module 250. While many thousands of signals can be selected by this architecture, the amount of signals that can be observed on the logic analyzer simultaneously is limited by the number of channels available on the device. In addition, many high frequency designs require gigahertz (GHz) bandwidth on the logic analyzer for capture. In contrast, ODLA 260 can observe far more signals than a logic analyzer, and can capture signals at their native speed. The content of the module can be downloaded by a test tool or captured on the logic analyzer at a much slower speed range (e.g., megahertz (MHz)).

Embodiments further enable customer sightings to be easily debugged without tampering with the critical information from the customer or disclosing vendor technology. Typically, at a vendor's lab the customer's environment is re-created as close as possible. However, missing a subtle piece of information can easily cause divergence in the debug scenario and prolong the debug time. Embodiments thus capture accurate information from a customer and make reproduction of bugs easier. The cycle accurate information also enables an application engineer to analyze a bug without reproducing the bug at all, improving debug time, increasing productivity, and enhancing customer relationships. In various embodiments, a customer can be provided instructions to save silicon information in an internal module and then download the content for later viewing. Specifically, when a sighting is filed by a customer, product engineers of the vendor can provide the customer with the configuration of this ODLA without revealing what is being captured. The customer can create the bug scenario in its own lab. The content of the module can then be extracted and shipped back to the product lab of the vendor and analyzed by product engineers with the detailed and accurate signal behavior at the time of the bug.

Figure 8:
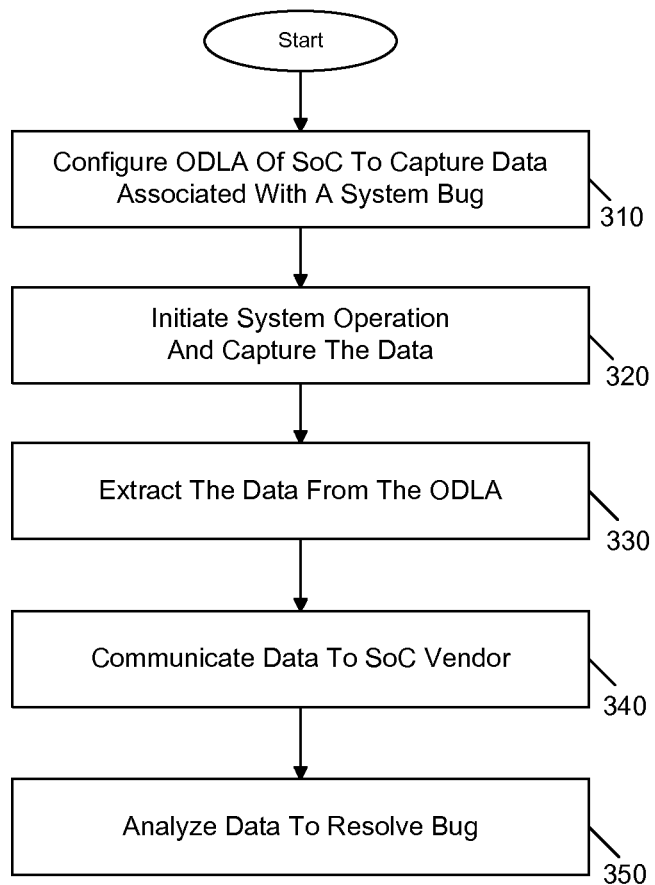
FIG. 8 is a flow diagram of a method in accordance with one embodiment of the present invention.

Referring now to FIG. 8, shown is a flow diagram of a method in accordance with one embodiment of the present invention. As shown in FIG. 8, method 300 may be used to capture debug information in a field situation, e.g., at a customer location and enable transmission of the information to a vendor of the SoC to perform debugging based on the information. In FIG. 8, method 300 may begin by configuring an ODLA of the SoC to capture data associated with a system bug (block 310). In one embodiment, a customer may receive information from the vendor to configure this ODLA, which typically remains hidden to the customer. Such information may include various configuration information for configuration registers of the ODLA, as well as triggering information. In certain embodiments, one or more test patterns may also be provided for input into the ODLA to enable a predetermined test to be run from storage of this test data in a trace buffer of the ODLA. As one example, the received information may be via a secure Internet connection, although the scope of the present invention is not limited in this regard.

Referring still to FIG. 8, next the customer may initiate system operation and accordingly, the ODLA may automatically capture the data as set up by the configuration information (block 320). Then the data may be extracted (block 330). This data extraction may occur at lower speeds than the at native speed of data capture. In various embodiments, a logic analyzer, other test equipment or a computer system coupled, e.g., to a debug port of the ODLA, may extract the information and place it in an appropriate file. This file may then be communicated to the SoC vendor (block 340). While the scope of the present invention is not limited in this regard, in one implementation the data may be communicated via the Internet on a secure channel. Then, debug, field, test engineers or others of the vendor may analyze the data to resolve the bug (block 350). In this way, the need to replicate the bug present at a customer's location in the vendor's lab can be avoided. While shown with this particular implementation in the embodiment of FIG. 8, the scope of the present invention is not limited in this regard. For example, in some implementations such as where the system capture is performed by the SoC vendor, control may pass directly from block 330 to block 350.

Thus using an embodiment of the present invention, information from on-die at-speed internal nodes can be captured. Further, embodiments can be compatible with and enhance existing internal node observation debug features, and coordinate events from other debug features via a system clock timestamp, which can reduce the cost of debug hardware, i.e., there is no need for high-end expensive logic analyzers. Embodiments may further be flexible to any platform setup, regardless of customer specific board features and can improve customer-designer debug throughput time.

Embodiments thus provide portability and scalability to enable debugging of embedded interconnects and enable coverage in portions of the chip beyond the processor. The buffer and trigger logic in the ODLA enable embodiments to be leveraged on any product having an internal interconnect. In various embodiments, the preloading and unloading of the buffer can occur at a slow speed which reduces the need for high-end (i.e., high cost) equipment. Further, by providing a responder for HVM test, all of the functional HVM test content required for CPU HVM testing can be reused across different SoC's without the need for test porting, re-validation, and fault grading costs.

Embodiments further enable faster debug of wide internal interfaces not visible to external logic analyzers, potentially reducing debug time from weeks to hours. Further, by providing an on-die LA, associated logic analyzer costs for testing a SoC product can be avoided.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system on a chip (SoC) comprising:
a first agent and a second agent coupled via an uni-directional interconnect; and
a logic analyzer having a trace buffer to store first information communicated from the first agent to the second agent and to store second information communicated from the second agent to the first agent, and to provide the first and second information to an external agent, wherein the trace buffer includes a first portion to store transactions from the first agent to the second agent and a second portion to store transactions from the second agent to the first agent.

2. The SoC of claim 1, wherein the second portion is to be pre-loaded with test content to perform high volume manufacturing (HVM) testing on the SoC, and the first portion is to store the transactions from the first agent to the second agent during the HVM testing.

3. The SoC of claim 1, wherein the logic analyzer includes a trigger logic to enable start of capture of a trace into the trace buffer and to stop the trace capture.

4. The SoC of claim 3, wherein the trigger logic is to enable the trace capture upon occurrence of an event in the SoC, under control of information stored in at least one configuration register of the logic analyzer.

5. The SoC of claim 2, wherein the second agent further comprises a bus responder to receive signals from the first agent and to transmit signals to the first agent, and a first test interface to couple the logic analyzer to a first external interface via a first serial interconnect.

6. The SoC of claim 5, wherein the second agent comprises a first selector to select an output from the logic analyzer or the bus responder to communicate to the first agent, wherein the first selector is to provide the test content to the first agent during the HVM testing.

7. The SoC of claim 1, further comprising an internal observation node module to receive debug signals from a plurality of debug nodes of the SoC and to provide the debug signals and a clock signal to the logic analyzer, the logic analyzer including a pre-storage module to receive the debug signals and the clock signal and to allocate a plurality of the debug signals into a data line with a time stamp for storage into a line of the trace buffer.

8. The SoC of claim 1, wherein the logic analyzer is to automatically capture data during operation of the SoC at a customer site, including automatically storing the first information communicated from the first agent to the second agent in the first portion of the trace buffer, extract the data including the first information from the logic analyzer, and communicate the data to a SoC vendor of the SoC.

9. The SoC of claim 1, further comprising a time stamp logic to update a first data block with a time stamp, to correlate events occurring in the SoC.

10. A non-transitory computer readable medium comprising instructions that enable a system to:
configure an on-die-logic-analyzer (ODLA) of a system-on-chip (SoC) with a test pattern to be stored in a trace buffer of the ODLA, and to enable capture of data associated with a system bug;
initiate operation of the SoC and enable the ODLA to automatically capture the data during the operation at a customer site, including automatically storing first data communicated from a first agent to a second agent of the SoC coupled to the first agent via a uni-directional interconnect, the first data stored in a first storage of the trace buffer dedicated to the first agent;
extract the data including the first data from the ODLA; and
communicate the data to the SoC vendor.

11. The non-transitory computer readable medium of claim 10, further comprising instructions that enable the system to dynamically combine a second storage of the trace buffer with the first storage to store a portion of the first data communicated from the first agent to the second agent.

12. The non-transitory computer readable medium of claim 11, further comprising instructions that enable the system to dynamically combine the first and second storages when the first storage is full and the second agent dedicated to the second storage is inactive.

13. The non-transitory computer readable medium of claim 10, further comprising instructions that enable the system to extract the data via a computer system, and place the data in a file for communication to the SoC vendor via the internet.

14. A system comprising:
a system on a chip (SoC) including a processor and a second agent coupled via an interconnect, an observation module, and a logic analyzer coupled to the observation module, the logic analyzer having a trace buffer including a first portion to store first information communicated from the processor to the second agent and a second portion to store second information communicated from the second agent to the processor, wherein the second portion is to be dynamically combined with the first portion when the first portion is full and the second portion is inactive; and a second logic analyzer coupled to the SoC via a second interconnect, wherein the second logic analyzer is to receive the first and second information via the observation module.

15. The system of claim 14, wherein the first portion is to store transactions from the processor to the second agent and the second portion is to store transactions from the second agent to the processor, the second portion to be pre-loaded with test content to perform high volume manufacturing (HVM) testing on the SoC, and the first portion to store the transactions from the processor to the second agent during the HVM testing.

16. The system of claim 14, wherein the SoC comprises a pre-memory module to package a plurality of internal node observation signals into a plurality of data blocks corresponding to a data line of a memory of the SoC and a time stamp logic to update a first data block of the plurality of data blocks with a time stamp.

* * * * *